United States Patent [19]
Lim

[11] Patent Number: 6,101,133
[45] Date of Patent: Aug. 8, 2000

[54] APPARATUS AND METHOD FOR PREVENTING ACCIDENTAL WRITES FROM OCCURRING DUE TO SIMULTANEOUS ADDRESS AND WRITE ENABLE TRANSITIONS

[75] Inventor: Steve W. Lim, Cupertino, Calif.

[73] Assignee: Integrated Silicon Solution, Inc., Santa Clara, Calif.

[21] Appl. No.: 09/337,017

[22] Filed: Jun. 30, 1999

[51] Int. Cl.[7] ........................................................ G11C 7/00
[52] U.S. Cl. ................ 365/189.04; 365/241; 365/230.08
[58] Field of Search ............................... 365/189.04, 233, 365/233.5, 230.01, 241, 230.08

[56] References Cited

U.S. PATENT DOCUMENTS

| | | | |
|---|---|---|---|
| 4,751,680 | 6/1988 | Wang et al. .............................. | 365/203 |
| 5,335,206 | 8/1994 | Kawamoto ............................ | 365/233.5 |
| 5,414,672 | 5/1995 | Ozeki et al. ............................ | 365/233 |

Primary Examiner—David Nelms
Assistant Examiner—Thong Le
Attorney, Agent, or Firm—Pennie & Edmonds LLP

[57] ABSTRACT

A Random Access Memory (RAM) with improved memory access time supporting simultaneous transitions of an address signal and a write enable signal while preventing accidental writes. The RAM includes a memory array, an address transition detector and a race detector. Operation of the memory array is controlled by the address signal and a write clock signal. In response to the write clock's read state the memory array reads data from an address represented by the address signal, while the write clock's write state causes the memory array to write data at the address represented by the address signal. The address transition detector and race detector work together to generate the write clock signal. The address transition detector generates an address transition signal when it detects a transition of the address signal from a representation of a first address of the memory array to a representation of a second address of the memory array. The address transition signal is coupled to the race detector, which, if the write clock is currently in its write state, forces the write clock to its read state before the address signal propagates to the memory array.

10 Claims, 5 Drawing Sheets

APPARATUS AND METHOD FOR PREVENTING ACCIDENTAL WRITES FROM OCCURRING DUE TO SIMULTANEOUS ADDRESS AND WRITE ENABLE TRANSITIONS

The present invention relates generally to an improvement in a SRAM and particularly to an improved asynchronous SRAM that prevents accidental writes from occurring due to simultaneous transitions of write enable and address signals.

BACKGROUND OF THE INVENTION

FIG. 1 illustrates, in block diagram form, an asynchronous Static Random Access Memory (SRAM) 20. SRAM 20 includes Address Buffer 22, Memory Array 24, and Clock Buffer 26. The Write Enable# signal controls the operation of SRAM 20. SRAM 20 responds to the write state (logic low) of the Write Enable # signal by writing the data represented by the Data signal to an address within Memory Array 24 represented by the Address signal. In response to the read state (logic high) of the Write Enable# signal, SRAM 20 reads from Memory Array 24 the data stored at the address represented by the Address signal.

The Joint Electron Device Engineering Council (JEDEC) promulgates standards for semiconductor devices, including SRAM. A JEDEC standard specifies that address hold time, $T_{AH}$, must be zero. In other words, an SRAM must support simultaneous transitions of the Write Enable # signal and the Address signal. Usually, the delay of the Address Buffer 22 is such that given simultaneous transitions of both the Write Enable# signal and the Address signal a transition in the Write Clock signal will reach Memory Array 24 before a transition of the X-Address/Y-Address signal. Thus, usually, only the desired operations occur. But this is not always the case, as illustrated by the timing diagram of FIG. 2. At a time $t_1$ both the Write Enable # signal 13 and the Address signal 15 transition simultaneously. Prior to $t_1$ these signals represented a command to write data to a first address, Address 1, whereas after $t_1$ they represent a command to read the data at a second address, Address 2. At time $t_2$ the X-Address/Y-Address signal 23 transitions from a representation of Address 1 to representation of Address 2; however, the Write Clock signal 29 remains at its active high level, representative of a write command, until $t_2$. Consequently, for the period between $t_2$ and $t_3$, Memory Array 24 writes to Address 2, corrupting the data stored there.

Prior SRAM 30, illustrated in FIG. 3, prevents accidental writes from occurring due to simultaneous transitions of the Write Enable# and Address signals. SRAM 30 does so by inserting a Delay 32 into the address signal, ensuring that transitions of the X-Address/Y-Address signal reach Memory Array 24 after the Write Clock signal, even given simultaneous transitions of the Write Enable# and Address signals. SRAM 30 pays for this certainty with increased access time, defined as the delay from an Address signal transition to when valid data is available from Memory Array 24. In SRAM 30, read access time is approximately the sum of the delay times of Address Buffer 22, Delay 32 and Memory Array 24. Delay 32 may be a small percentage of the total access time, 10% or less, and on the order of a nanosecond; however, such an increase in access time is significant. SRAMs are frequently used to construct secondary microprocessor caches; as such their access times must be compatible with increasing microprocessor clock rates. Thus, a need exists to reduce SRAM access time while preventing accidental writes from occurring due to simultaneous transitions of the Write Enable# and Address signals.

SUMMARY OF THE INVENTION

The present invention is a Random Access Memory (RAM) with improved memory access time supporting simultaneous transitions of an address signal and a write enable signal while preventing accidental writes. Briefly described, the RAM of the present invention includes a memory array, an address transition detector and a race detector. Operation of the memory array is controlled by address and write clock signals. In response to a read state of the write clock the memory array reads data from an address represented by the address signal, while a write state of the write clock causes the memory array to write data at the address represented by the address signal. The address transition detector and race detector work together to generate the write clock signal. The address transition detector generates an address transition signal when it detects a transition of the address signal from a representation of a first address of the memory array to a representation of a second address of the memory array. The address transition signal is coupled to the race detector, which, if the write clock is currently in its write state, forces the write clock to its read state before the address signal propagates to the memory array. This prevents the memory array from accidentally writing to the second address.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 4:
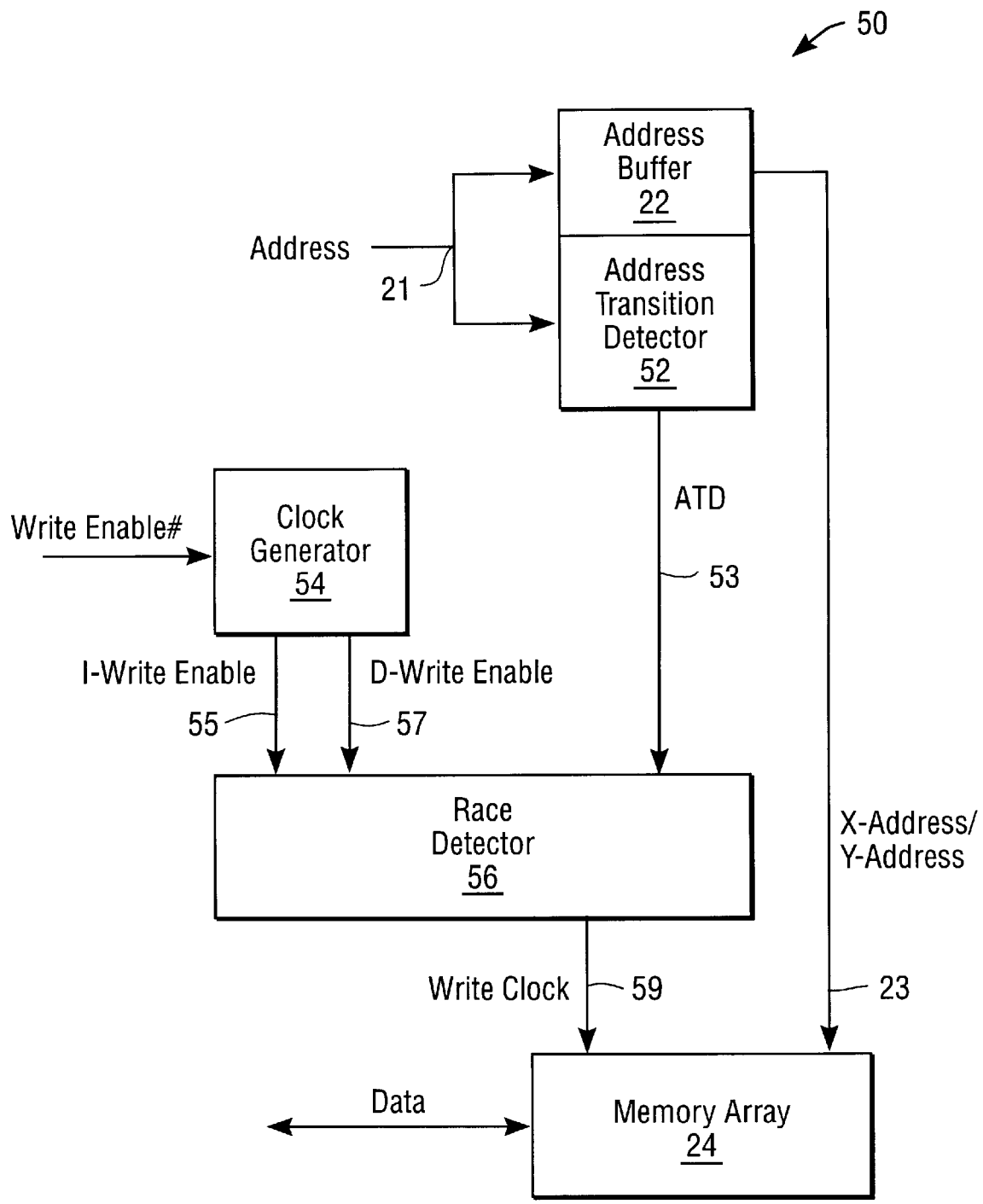
FIG. 4 is a block diagram of an asynchronous SRAM in a preferred embodiment of the present invention.

FIG. 4 illustrates, in block diagram form, SRAM 50 of the present invention. SRAM 50 prevents accidental writes from occurring following simultaneous transitions of the Write Enable# and Address signals and provides reduced access times as compared to prior SRAM 30. Rather than introducing delay between the Address signal on line 21 and Memory Array 24 to ensure that transitions of X-Address/Y-Address signal on line 23 occur after transitions of the Write Clock signal on line 57, SRAM 50 shortens the write state of the Write Clock signal in response to substantially simultaneous transitions of the Address and Write Enable# signals. This insures that transitions of the Write Clock signal will reach Memory Array 24 prior to a transition of the X-Address/Y-Address signal.

SRAM 50 provides this surety using Address Transition Detector 52, Clock Generator 54 and Race Detector 56. Address Transition Detector 52 detects whenever there is a change in the address represented by the Address signal and signals that transition by briefly pulsing the ATD signal, which is coupled to Race Detector 56 via line 53. Clock Generator 54 generates the other two signals input to Race Detector, the I-Write Enable and D-Write Enable signals. The I-Write Enable signal on line 55 functions as an internal write clock and is a delayed and inverted version of the Write Enable# signal on line 23. The D-Write Enable signal on line 57 is an uninverted and delayed version of the Write Enable# signal. The delay of the D-Write Enable signal from the Write Enable# signal is greater than the delay of the I-Write Enable signed from the Write Enable# signal. Race Detector 56 generates the Write Clock signal, which selects between the read and write functions of Memory Array 24. Race Detector 56 passes the I-Write Enable signal unchanged as the Write Clock signal while the D-Write Enable and ATD signals are stable. However, while the Write Clock is in its write state, if the ATD signal transitions to its active state, less than a nanosecond later Race Detector 56 forces the Write Clock signal to its read state. This ends the write cycle of Memory Array 24 before the X-Address/Y-Address signal on line 23 represents a new address, thereby preventing an accidental write at the new address.

Figure 1:
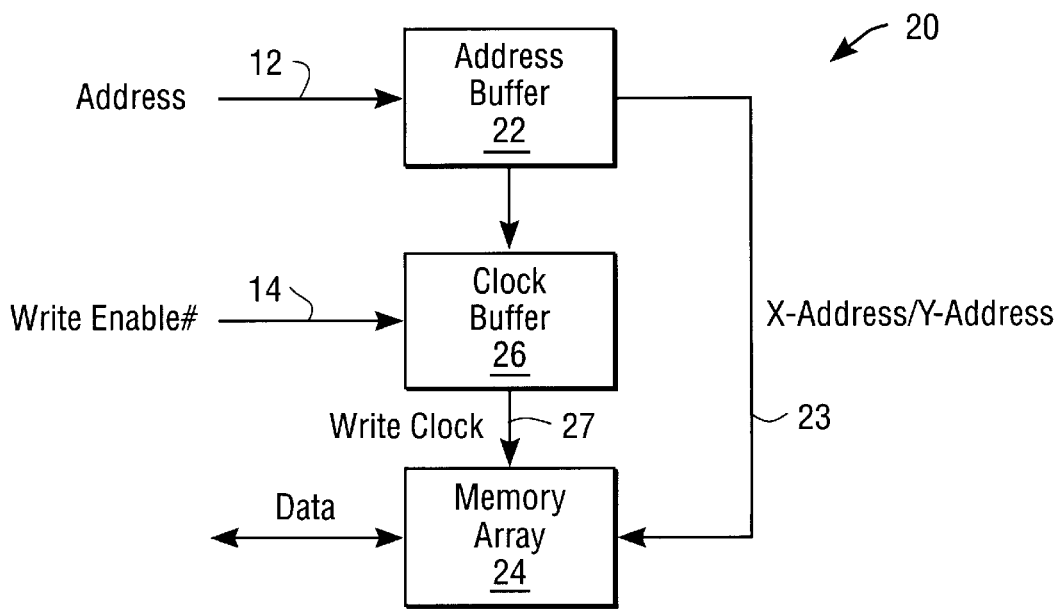
FIG. 1 is a block diagram of a first prior art SRAM.
Figure 3:
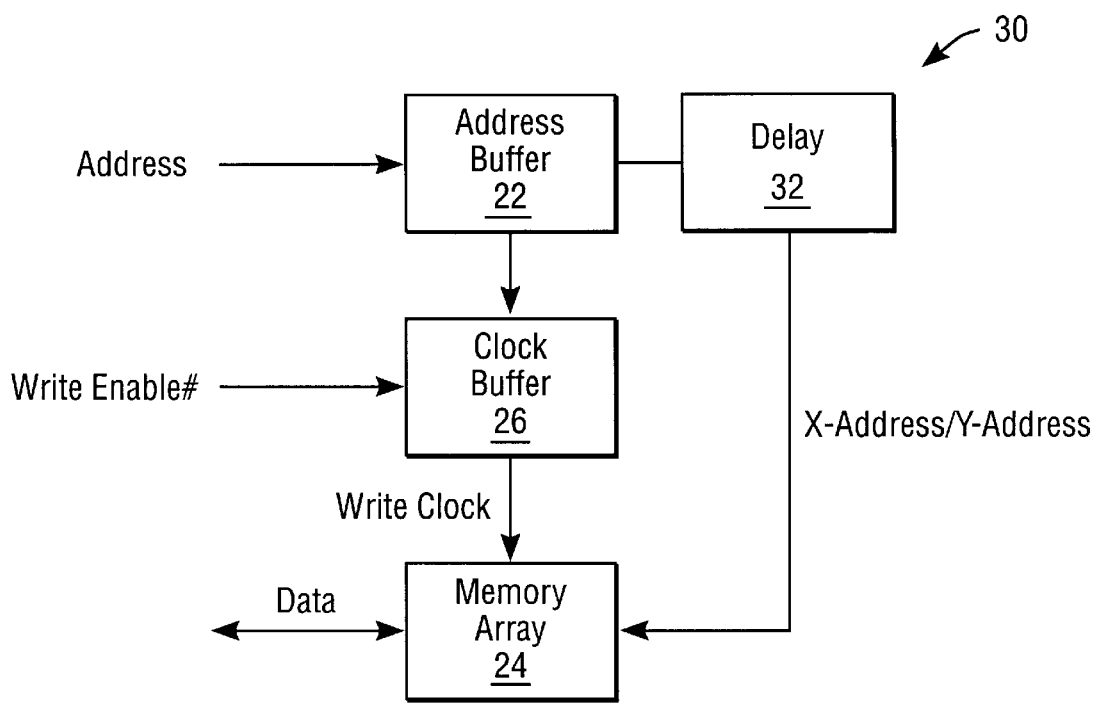
FIG. 3 is a block diagram of a second prior art SRAM.
Figure 2:
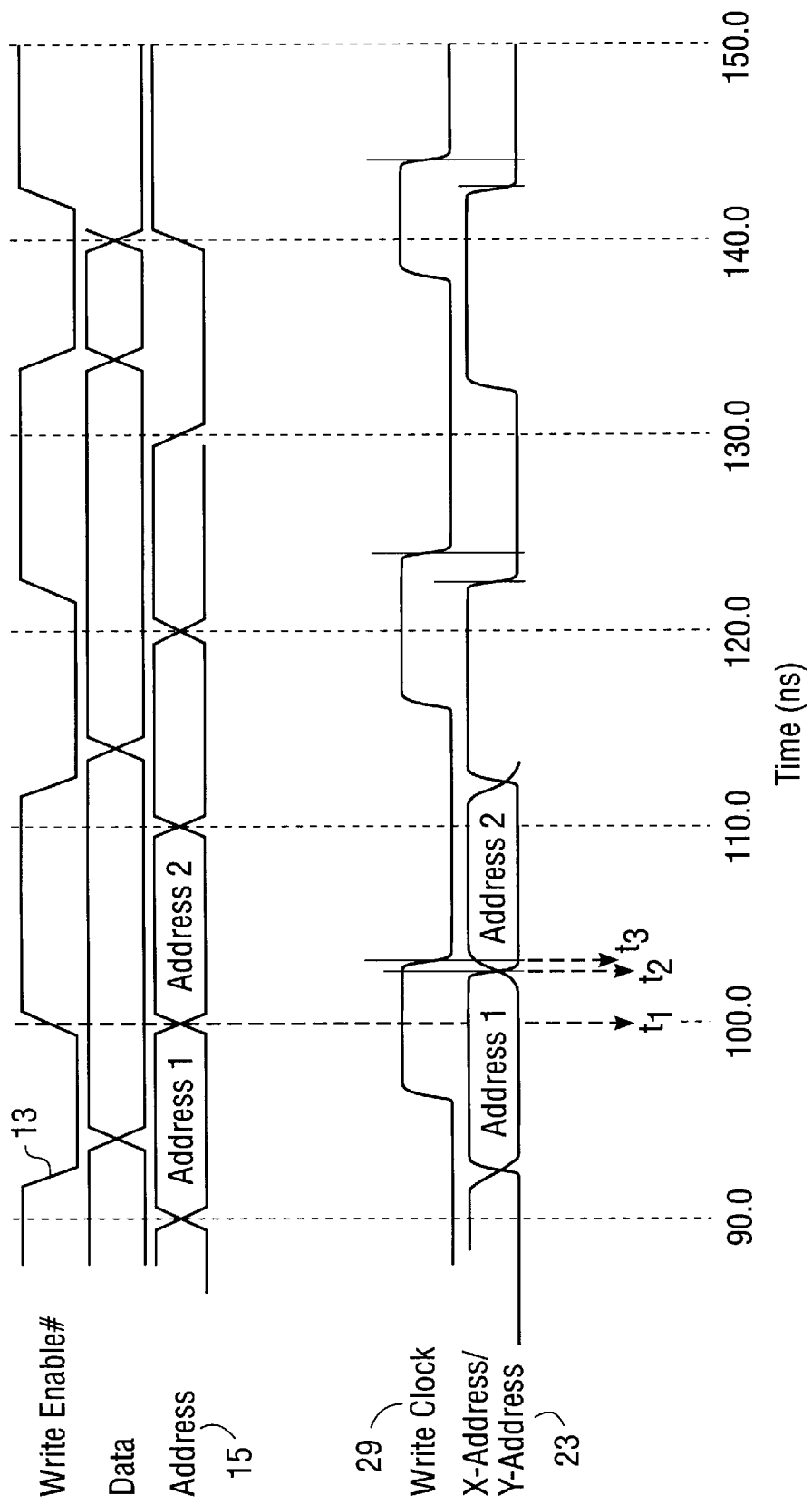
FIG. 2 is a timing diagram for the prior art SRAM of FIG. 1.

Within SRAM 50 the time period between an address transition and the end of a write cycle ("write kill time") is determined by the delay of Address Transition Detector 52 and Race Detector 56. According to the present invention the write kill time is less than Address Buffer propagation delay, eliminating the need for a delay in the address signal path to Memory Array 24. Thus, the read access time of SRAM 50 is approximately equal to the combined propagation delay of Address Buffer 22 and Memory Array 24, which is an improvement over prior art SRAM 30 of FIG. 3.

Address Transition Detector 52 may be realized as a series of parallel pulse generators, one each for each bit of the Address signal. The delay time of Address Transition Detector 52 is substantially less than that of Address Buffer 22, which must drive a much greater capacitive load.

Figure 5:
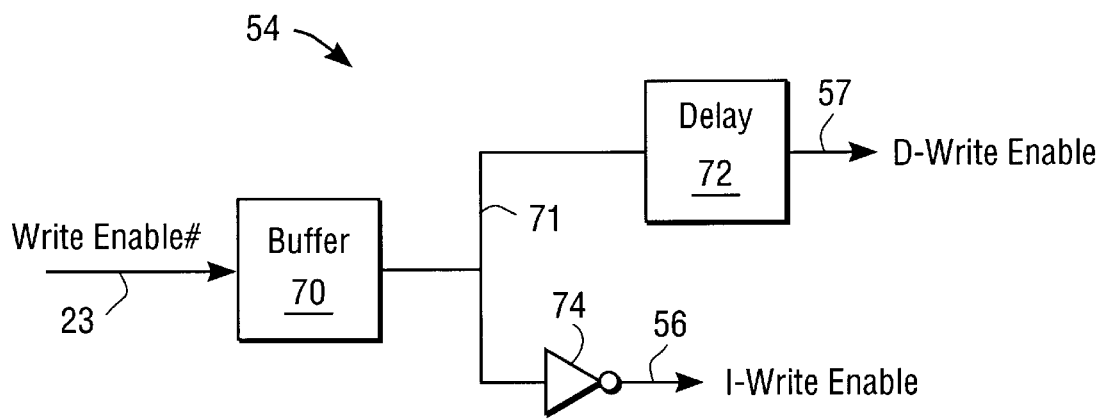
FIG. 5 is a block diagram of a clock generator in a preferred embodiment of an SRAM of the present invention.

FIG. 5 illustrates, in block diagram form, Clock Generator 54, which includes Buffer 70, Delay 72 and Inverter 74. Buffer 70 receives the Write Enable# signal and increases the signal's drive capacity before coupling it to Delay 72 and Inverter 74. Delay 72 further delays the buffered version on line 71 of the Write Enable# signal prior to outputting it as the D-Write Enable signal. Inverter 74 generates the I-Write Enable signal by inverting the buffered version of the Write Enable signal.

Figure 6:
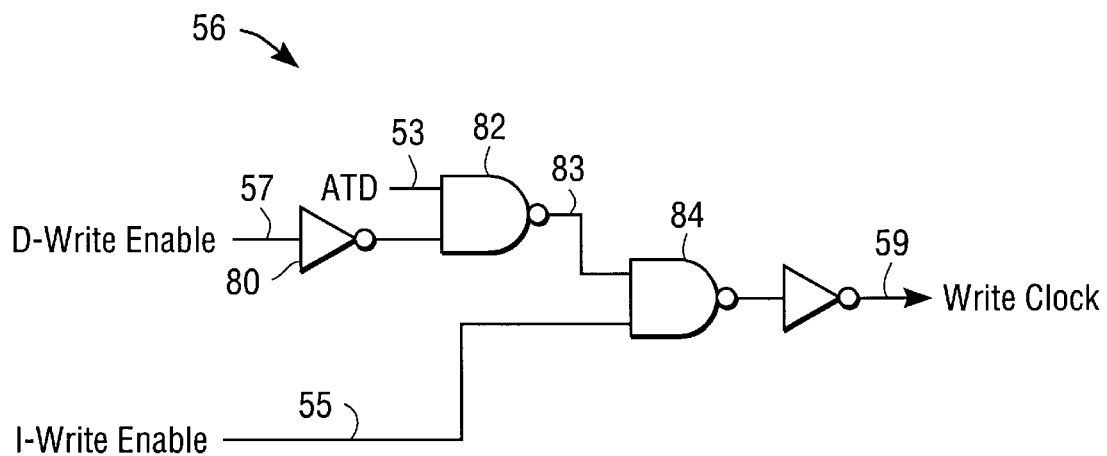
FIG. 6 is a block diagram of a race detector in a preferred embodiment of the present invention.

FIG. 6 illustrates, in block diagram form, Race Detector 56, which includes Inverter 80, and NAND gates 82 and 84. Inverter 80 inverts the D-Write Enable signal and couples it to one of the inputs of NAND gate 82. The ATD signal is coupled to the other input of NAND gate 82. NAND gate 82 couples its output, the Gate signal on line 83, to NAND gate 83. The I-Write Enable signal is coupled to the other input of NAND gate 84, which generates the Write Clock signal on line 59. Inverter 80 and NAND gates 82 and 84 cooperate to shorten, or kill, a memory write cycle by forcing the Write Clock signal from its write state to its read state when an address transition occurs. While the ATD and D-Write Enable signals are stable, the Gate signal is stable at some logic level and the I-Write Enable signal determines the logic level of the Write Clock signal. Consider the response of Race Detector 56 when the ATD signal pulses logic high while the I-Write Enable signal is a logic high, the D-Write Enable signal is a logic low and the Write Clock signal is a logic high, indicating a write. NAND gate 82 responds to the change in state of the ATD signal by forcing the Gate signal to a logic low from a logic high. NAND gate 84 responds to this change in the Gate signal by bringing its output high, thus forcing the Write Clock signal to a logic low, the read state.

Figure 7:
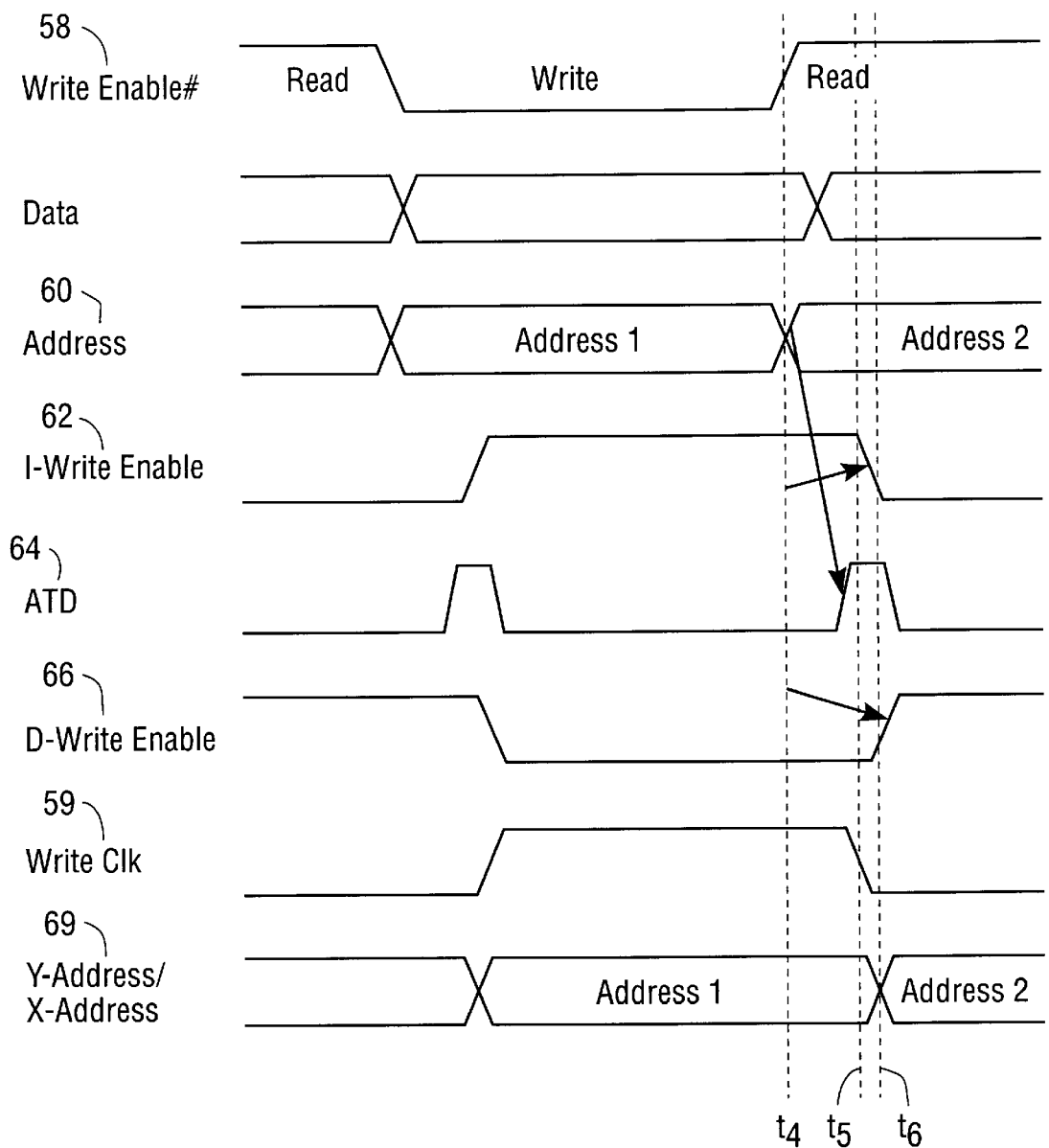
FIG. 7 is a timing diagram illustrating the response of a preferred embodiment of an SRAM of the present invention to simultaneous transitions of the write enable and address signals.

The timing diagram of FIG. 7 is a simulation of the response of SRAM 50 to simultaneous transitions of the Write Enable# signal 58 and the Address signal 60 while the X-Address/Y-Address and the Write Clock signals, 69 and 68, command Memory Array 24 to write to a first address, Address1. At time $t_4$ the Address signal 60 transitions from a representation of Address1 to a representation of a second address, Address 2. Also at $t_4$ the Write Enable# signal 58 transitions from its write state, a logic low, to its read state, a logic high. Address Transition Detector 56 (of FIGS. 4 and 5) responds first, pulsing the ATD signal 64 to an active level (logic high) at time $t_5$. Race Detector 56 responds a short time later, at $t_6$, to the change in the logic level of the ATD signal 64 by pulling the Write Clock signal 68 from a logic high, the write state, to a logic low, the read state. This kills the memory write cycle.

The X-Address/Y-Address signal 69 does not transition to a representation of Address2 until after, at $t_6$ Thus, Memory Array 22 cannot accidentally write data to Address2.

ALTERNATE EMBODIMENTS

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. Circuitry for preventing accidental writes to a memory from occurring due to simultaneous transitions of an address signal and a write enable signal, the circuitry comprising:
   a. an address buffer for buffering the address signal to generate an internal address signal representing an address within the memory, the address buffer having a first delay of a first duration;
   b. an address transition detector for generating an address transition signal in response to detection of a transition of the address signal, the address transition detector have a second delay of a second duration; and
   c. a race detector for generating a write clock signal in response to the write enable signal and the address transition signal, the write clock signal having a read state and a write state, the read state of the write clock signal causing the memory to read data from the address represented by the internal address signal, the write state of the write clock signal causing the memory to write data at the address represented by the internal address signal, the race detector forcing the write clock to the read state in response to an active state of the address transition signal, the race detector having a third delay of a third duration, a combined delay of the second and third duration being less than the first duration.

2. The circuitry of claim 1 wherein the address transition detector comprises a pulse generator.

3. The circuitry of claim 1 wherein the race detector comprises:
   a first logical NAND gate having a first input and a first output, the address transition signal being coupled to the first input of the first logical NAND gate; and a second logical NAND gate having a second input, a third input and a second output, the second input being coupled to the first output, the write enable signal being coupled to the third input, the second output providing the write clock signal.

4. A Random Access Memory (RAM) with improved memory access time supporting simultaneous transitions of an address signal and a write enable signal while preventing accidental writes, the RAM comprising:

a. a memory array responsive to the address signal and a write clock signal, a read state of the write clock signal causing the memory array to read data from an address represented by the address signal, a write state of the write clock signal causing the memory array to write data at the address represented by the address signal;

b. an address transition detector for generating an address transition signal in response to detection of a transition of the address signal from a representation of a first address of the memory array to a representation of a second address of the memory array; and c. a race detector for generating the write clock signal in response to the write enable signal and the address transition signal, the race detector causing the write clock signal to transition to the read state from the write state in response to an active state of the address transition signal, the write clock signal transitioning to the read state prior to a first transition in the address signal propagating to the memory array.

5. The RAM of claim 4 further comprising:

d. a buffer for buffering the address signal and generating an internal address signal, the internal address signal being coupled to the memory array.

6. The RAM of claim 4 further comprising:

d. a clock generator for generating a delay clock signal in response to the write enable signal, the delay clock signal being coupled to the race detector.

7. The RAM of claim 6 wherein the clock generator has a first delay and wherein the race detector has a second delay, a combination of the first delay and the second delay being less than a propagation delay of the transition in the address signal to reach the memory array.

8. The RAM of claim 7 wherein the address transition detector comprises a pulse generator.

9. The RAM of claim 8 wherein the race detector comprises:

a first logical NAND gate having a first input and a first output, the address transition signal being coupled to the first input of the first logical NAND gate; and a second logical NAND gate having a second input, a third input and a second output, the second input being coupled to the first output, the delay clock signal being coupled to the third input, the second output providing the write clock signal.

10. A method of preventing accidental writes to a second address of a memory array when a transition of the address signal from a representation of a first address to a representation of the second address, the address signal transition occurring simultaneously with a write enable signal transition from a first write state to a first read state; the method comprising the steps of:

a. propagating the address signal to the memory array, the address signal transition taking a first period of time to propagate to the memory array;

b. detecting the transition of the address signal from the representation of first address to the representation of the second address and generating an address transition signal;

c. generating a write clock signal in response to the address transition signal and the write enable signal, the write enable signal transition from the first write state to the first read state enabling the write clock signal to transition from a second write state to a second read state, the write clock signal taking a second period of time after the write enable transition to transition to the second read state from the second write state, the second period of time being less than the first period of time; and d. performing at an address of the memory array represented by the address signal a one of a read and a write in response to the write clock signal.

* * * * *